United States Patent
Grundy et al.

(10) Patent No.: US 8,199,450 B2
(45) Date of Patent: Jun. 12, 2012

(54) ESD PROTECTION UTILIZING RADIATED THERMAL RELIEF

(75) Inventors: Kevin P. Grundy, Fremont, CA (US); Joseph C. Fjelstad, Maple Valley, WA (US)

(73) Assignee: Samsung Electronics Co., Ltd. (KR)

( * ) Notice: Subject to any disclaimer, the term of this patent is extended or adjusted under 35 U.S.C. 154(b) by 358 days.

(21) Appl. No.: 12/435,812

(22) Filed: May 5, 2009

(65) Prior Publication Data
US 2010/0284115 A1   Nov. 11, 2010

(51) Int. Cl.
*H02H 7/20* (2006.01)
*H02H 1/00* (2006.01)
*H01C 7/10* (2006.01)

(52) U.S. Cl. ............... 361/112; 361/127; 338/21

(58) Field of Classification Search .......... 361/112, 361/127; 338/21
See application file for complete search history.

(56) References Cited

U.S. PATENT DOCUMENTS

| | | | |
|---|---|---|---|
| 3,685,026 A | 8/1972 | Wakabayashi et al. | |
| 4,726,991 A | 2/1988 | Hyatt et al. | |
| 4,780,598 A * | 10/1988 | Fahey et al. | 219/511 |
| 4,809,124 A * | 2/1989 | Kresge | 361/58 |
| 4,928,199 A | 5/1990 | Diaz et al. | |
| 4,977,357 A | 12/1990 | Shrier | |
| 5,068,634 A | 11/1991 | Shrier | |
| 5,095,239 A * | 3/1992 | Wang | 310/221 |
| 5,099,380 A | 3/1992 | Childers et al. | |
| 5,128,785 A * | 7/1992 | Yoshimoto et al. | 349/53 |
| 5,142,263 A | 8/1992 | Childers et al. | |
| 5,189,387 A | 2/1993 | Childers et al. | |
| 5,246,388 A | 9/1993 | Collins et al. | |
| 5,248,517 A | 9/1993 | Shrier et al. | |
| 5,262,754 A * | 11/1993 | Collins | 338/21 |
| 5,807,509 A | 9/1998 | Shrier et al. | |
| 6,108,184 A * | 8/2000 | Minervini et al. | 361/111 |
| 2004/0066599 A1 * | 4/2004 | Werner et al. | 361/118 |

FOREIGN PATENT DOCUMENTS

| | | |
|---|---|---|
| WO | WO 96/02924 | 2/1996 |
| WO | WO 97/26665 | 7/1997 |

* cited by examiner

*Primary Examiner* — Jared Fureman
*Assistant Examiner* — Scott Bauer
(74) *Attorney, Agent, or Firm* — Myers Bigel Sibley & Sajovec

(57) ABSTRACT

An ESD device with a protection structure utilizing radiated heat dissipation to prevent or reduce thermal failures. The device includes a voltage switchable polymer 10 between electrodes 11 and 12, which is configured to provide a heat radiating surface 40 for radiating heat when an ESD condition occurs. A radiation transmission material 19 is disposed between the heat radiating surface and the environment for radiating heat 20 when an ESD event occurs. One embodiment adds a spacer 50 for accurately spacing electrodes. A method for fabricating the device is further illustrated.

8 Claims, 6 Drawing Sheets

US 8,199,450 B2

ESD PROTECTION UTILIZING RADIATED THERMAL RELIEF

FIELD OF THE INVENTION

The present invention relates to the field of electrostatic discharge protection of semiconductor circuits utilizing non-semiconductor electrostatic discharge ("ESD") protection.

BACKGROUND

Electrostatic discharge events can destroy microelectronic circuits, so integrated circuit ("IC") devices are commonly provided with such protection, normally on the IC chip (also called an IC die). On the chip, each diode is arranged so that any voltages on the I/O pad, which exceed the voltage of either the power supply or ground potential, cause conduction in the diodes, thus shunting the current induced by the voltage. Other than the momentary voltage drop of the diodes, the peak voltage seen by the internal logic of a semiconductor is limited. This technique is reasonably common and works well for many I/O circuits not requiring high-speed signal switching.

As semiconductor lithography has progressed over time and allowed finer transistor geometries to be manufactured, signal speeds have become increasingly limited by capacitive and resistive elements in semiconductor circuits. One source of unwanted capacitance stems from the ESD protection devices used in I/O buffers in semiconductors. An example of a typical ESD protection circuit 100 is shown in FIG. 1. The diodes 102 attached to the I/O pad 104 are in place to divert and redirect higher voltages appearing on the I/O pad away from the semiconductor chip device to either the power supply feed ("Vdd") or the ground ("Gnd:"). Unfortunately, the capacitance added by the addition of the diodes (inherent in the physics of the diode PN junction), makes the structure too slow for use in higher speed signaling that is in use today, and expected to increase in the future. One approach for decreasing the capacitance on an I/O buffer is to replace the diodes with bi-directional devices that have very low capacitance. As a solution, voltage switchable polymers, infused with conductive particles, have emerged and proved viable as a low-capacitance bi-directional ESD protection device.

Voltage switchable polymer based ESD protection devices are attractive due to their ability to provide protection at extremely low capacitance, as they can be desirably structured and fabricated in very small sizes. They can also be easily manufactured into printed circuit board and integrated circuit packaging substrates. However, one of the challenges is that as these voltage switchable polymer based ESD devices shrink, their ability to dissipate heat also declines. One result is that large ESD events can destroy voltage switchable polymer based ESD devices. While in the course of their destruction they may protect the integrated circuit one time, it is possible that many ESD events will occur over the life of the product, thus it is desirable to create an alternative structure that will address this shortcoming. Voltage switchable polymer based ESD protection devices are attractive for their small capacitance values.

SUMMARY OF THE INVENTION

The apparatus of the invention provides for radiation of excess heat in a voltage switchable polymer based ESD protection device when an ESD event occurs. The voltage switchable polymer material is configured to provide a thermal radiation surface from which heat from an ESD event can radiate. The open area outside the thermal radiation surface may be occupied by a material with greater transmission of thermal radiation than voltage switchable polymer. This provides a thermal transmission window allowing heat to escape. Possible materials for the window include air, plastic, and vacuum. The resulting device is a low capacitance ESD with greater thermal capacity than prior art devices. The method describes means for fabricating the ESD device.

BRIEF DESCRIPTION OF THE FIGURES

The present invention is illustrated by way of example and not by way of limitation, in the figures in which like reference numerals refer to similar elements and in which.

DETAILED DESCRIPTION OF THE FIGURES

In the following description and in the accompanying drawings, specific terminology and drawing symbols are set forth to provide a thorough understanding of the present invention. In some instances, the terminology and symbols may imply specific details that are not required to practice the invention. For example, the when referring to voltage switchable polymer, this can imply any variety and type of voltage switchable polymer, suitable voltage switchable insulating material or porous insulating material for the suppression of electrostatic discharge ("ESD"). While conductors are presented as metal elements which exhibit low resistance, other elements possessing similar ability to provide low resistance, including semiconductor materials, may be used potentially and are thus not excluded.

Figure 1:
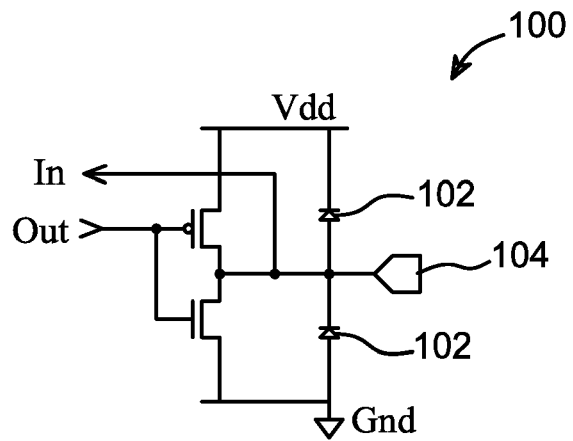
FIG. 1 is a schematic diagram of a prior art diode protection.

FIG. 1, a prior art technology, illustrates a simple implementation of an ESD protection circuit 100 with diodes 102. Each diode 102 is arranged so that any voltages on the I/O pad 104 which exceed the voltage of either the power supply or ground potential, cause conduction in the diodes, thus shunting the current induced by the voltage. Other than the momentary voltage drop of the diodes, the peak voltage seen by the internal logic of a semiconductor is limited. This technique is reasonably common and works well for many I/O circuits not requiring high-speed signal switching.

In use, the capacitance of such diodes can approach several picofarads for standard metal oxide silicon ("MOS") processes. At 50 MHz signal switching a 2 picofarad capacitive load feeding a 50 ohm driver impedance will contribute approximately 200 picoseconds of rise time delay onto a signal. Since the period of 50 MHz is 20 nanoseconds, its 200 picosecond rise time is insignificant and thus it does not pose a signal integrity problem. However, when a switching rate of 5 GHz is considered, with its 200 picosecond rise time, it is not possible for a signal to operate correctly, owing to the fact that the ESD protection circuitry response time is the same as the period of the signal itself.

Figure 2A:
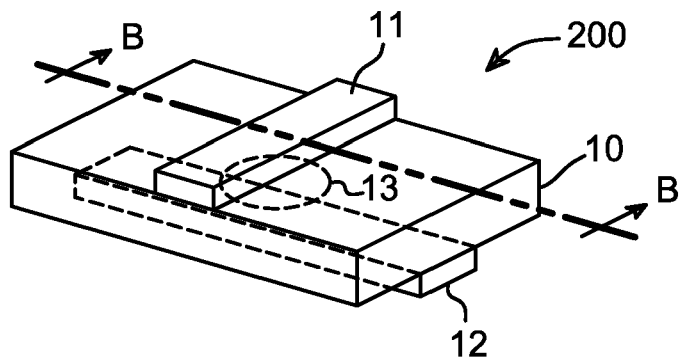
FIG. 2A is a perspective view of a prior art voltage switchable polymer ESD protection device.
Figure 2B:
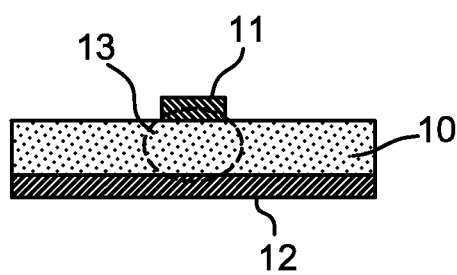
FIG. 2B is a sectional view of the FIG. 2A device.

FIG. 2A illustrates a current implementation of a filled voltage switchable polymer used to construct an ESD protection device 200. FIG. 2B shows a cross-sectional view of the device 200, taken along the line B-B identified in FIG. 2A. The three layer device 200 is comprised of a first conductive electrode 11 positioned over a suitable voltage switchable polymer layer 10, which is positioned over a second conductive electrode 12. The voltage switchable polymer 10 can be created from and filled with a variety of materials, including metal particles, nano metal particles, graphene, carbon nanotubes, metal coated voltage switchable polymer particles, etc., but which has the fundamental property of conducting electricity when a pre-established or preset voltage level is reached. A voltage switchable polymer (or material) may be a combination of a polymer and conductive materials which act as insulators up to an established voltage. A specific example of a voltage switchable dielectric material is provided by a material formed from a 35% polymer binder, 0.5% cross-linking agent, and 64.5% conductive powder. The polymer binder includes the product 35U silicone rubber sold under the trademark Silastic (belonging to Dow Corning); the cross-linking agent includes the product rubber organic peroxide sold under the trademark Varox, and the conductive powder includes nickel with a 10 micron average particle size. Another formulation for a voltage switchable material includes 35% polymer binder, 1.0% cross-linking agent, and 64.0% conductive powder where the polymer binder, the cross-linking agent, and the conductive powder are as described above.

Other examples of conductive particles, powders, or filaments for use in a voltage switchable dielectric material can include aluminum, beryllium, iron, silver, platinum, lead, tin, bronze, brass, copper, bismuth, cobalt, magnesium, molybdenum, palladium, tantalum carbide, boron carbide, and other conductive materials known in the art that can be dispersed within a material such as a binding agent. The non-conductive binding material can include organic polymers, ceramics, refractory materials, waxes, oils, and glasses, as well as other materials known in the art that are capable of inter-particle spacing or particle suspension. Examples of voltage switchable dielectric material are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665, all of which are incorporated by reference herein. Another example of a voltage switchable dielectric material is provided in U.S. Pat. No. 3,685,026, incorporated by reference herein, which discloses finely divided conductive particles disposed in a resin material. Yet another example of voltage switchable dielectric material is provided in U.S. Pat. No. 4,726,991, incorporated by reference herein, which discloses a matrix of separate particles of conductive materials and separate particles of a semiconductor material coated with an electrically insulative material. Other references have previously incorporated voltage switchable dielectric materials into existing devices, such as disclosed in U.S. Pat. No. 5,246,388 (connector) and U.S. Pat. No. 4,928,199 (circuit protection device), both of which are incorporated by reference herein.

When the voltage is exceeded, the voltage switchable polymer trips to conduct to ground any power surge. Referring again to FIGS. 2A, 2B, the junction 13 is defined by the overlap between the top 11 and bottom conductors 12. The junction of the two conductive electrodes 13 is surrounded by voltage switchable polymer which is not part of the overlap. As stated earlier, it is an important objective, when building an ESD protection device, to keep the overall capacitance of the device as low as practical. In the case of voltage switchable polymer based ESD protection devices, this may be achieved by keeping the overlap area to a minimum since capacitance is largely proportional to surface area of parallel plates in the overlap region.

Figure 3A:
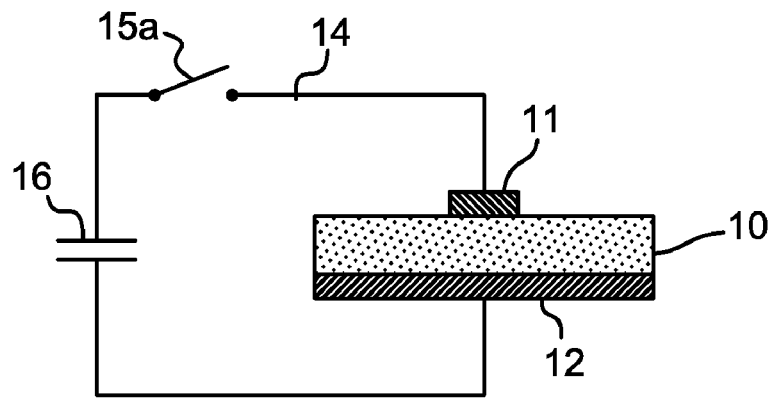
FIG. 3A is a schematic diagram of a test circuit for ESD connected to the FIG. 2A device.
Figure 3B:
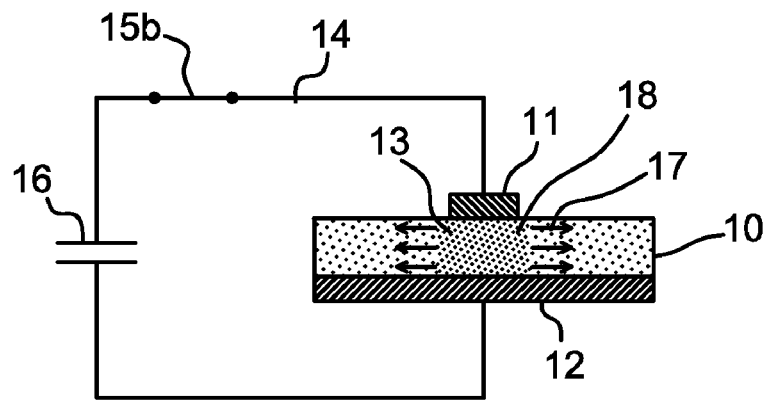
FIG. 3B illustrates the test circuit of FIG. 3A that has been enabled causing voltage switchable polymer to overheat and fail.

FIG. 3A illustrates the current-art voltage switchable polymer ESD protection device of FIGS. 2A, 2B in an ESD test circuit 14. The test circuit has not been activated. A charge to simulate an ESD event is placed onto a capacitor 16 with a test switch 15a in open position, preventing the charge from reaching the voltage switchable polymer ESD protection device. When the switch is closed, the charge on the capacitor 16 flows to both conductors 11, 12. If the voltage difference between the conductors exceeds the transition voltage of ESD voltage switchable polymer, then conduction takes place through the voltage switchable polymer in the junction area 13. FIG. 3B illustrates a current implementation example of how the flow of charge through the voltage switchable polymer, once the switch is in closed position 15b, results in heat 18 being rapidly generated at rate which is slow to diffuse away from the junction area 13 because by its nature, the material is not suitably designed to serve as a good thermal conductor. The directed line arrows 17 represent the conduction of heat away from the junction area. Note that a voltage switchable polymer based ESD protection device works most rapidly when the area of the junction 13, wherein heat 18 is generated, is as small as practical, thereby reducing its capacitance. Unfortunately, ESD events being shunted through a small junction area must also be concerned with localized generation of heat over a small junction volume. If the junction cannot conduct the generated heat from an ESD event away at a fast enough rate, then the temperature will rise and the junction region will be damaged and cease to function properly. Damage can occur in the form of opens, shorts, carbonization of the material or delamination but is not so limited.

Figure 4:
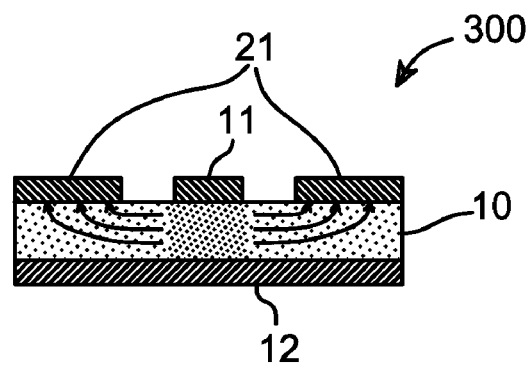
FIG. 4 is a section view of a second prior art voltage switchable polymer ESD protection device.

To improve the thermal dissipation capability of an ESD voltage switchable polymer junction, additional thermal dissipation structures to improve heat diffusion away from the junction can be added. FIG. 4 depicts a device 300 illustrating how additional conductor material 21 can be placed near the voltage switchable polymer ESD protection junction to provide thermal relief. Unfortunately, since suitable thermal conduction is required for these additional conductor materials 21 to be effective, they can provide only limited benefit to solving the problem of too much heat concentrated in a very small ESD voltage switchable polymer junction area. Further, this approach also limits high-speed performance. In order not to increase the junction area, the additional conductors 21 must be electrically connected to conductor 12, resulting in higher device capacitance than without the additional conductors, which is undesirable for high-speed operation.

Figure 5A:
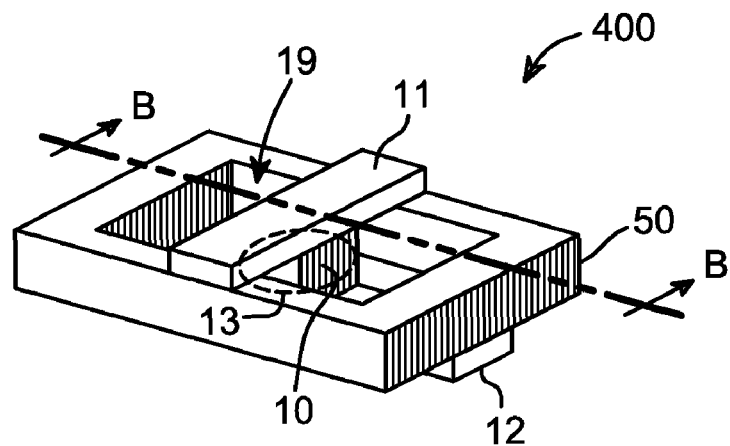
FIG. 5A is a perspective view of a first embodiment of the claimed invention.
Figure 5B:
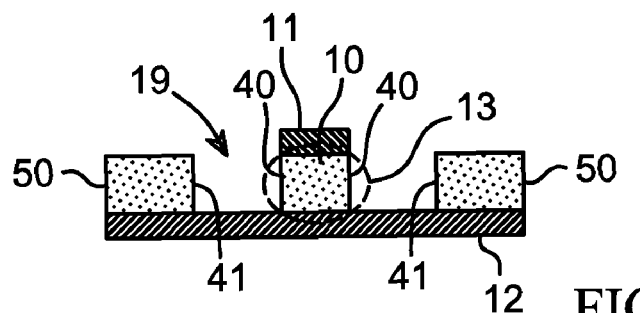
FIG. 5B is a section view of the FIG. 5A embodiment.

An embodiment of the current invention is illustrated in FIG. 5A, which shows a device 400 according to the invention. The device 400 is illustrated in further detail in FIG. 5B, in a cross-sectional view taken along line B-B identified in FIG. 5A. The device 400 includes a first conductive electrode 11 positioned over an ESD voltage switchable polymer layer 10, which is positioned over a second conductive electrode 12, forming a junction 13 in the overlap region of the electrodes 11, 12. The voltage switchable polymer 10 and junction 13 were described in detail hereinabove. Here, the ESD voltage switchable polymer material 10 comprising the ESD junction 13 has been isolated from surrounding material 50 by an open area 19, exposing a peripheral surface 40 around the junction 13 to provide a rapid thermal path for thermal radiation (e.g., infrared radiation or IR) away from the junction. This open area 19 can be, but is not limited to air, vacuum or any other efficient medium for transmission of radiated energy. Accordingly, the open area 19 can also be referred to as a "transmission window" or "transmission material". The open area 19, while shown to be completely surrounding the junction 13 in FIGS. 5A, 5B, is not so limited, as other embodiments of the invention may have a partially open area adjacent to the ESD junction 13. (In other words, in an alternate embodiment, the open area may not necessarily entirely circumscribe the junction.) In still alternate embodiments, the open area 19 can include a radiation transmission substance or material, partially or completely filling the area 19.

Figure 5C:
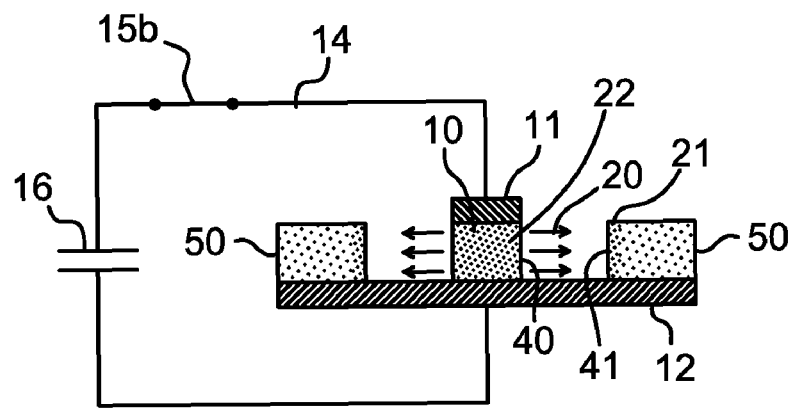
FIG. 5C is a schematic diagram of the FIG. 5A embodiment in a test circuit.

Opposite the radiating peripheral surface 40 is a receiving surface 41 for radiated thermal energy. In this embodiment, the receiving surface 41 includes an inner peripheral surface of the material 50. The material 50 is an electrically insulating (non-conducting) material that is suitable for construction of the device, according to the application. In alternate embodiments, the material 50 can be the ESD voltage switchable polymer 10 described hereinabove, or a polymer material without voltage switchable properties. High thermal conductivity is desirable in material 50. Possible materials 50 in still alternate embodiments of the invention include anodized aluminum, oxide, aluminum nitride, silicon dioxide, and materials employed for insulating (dielectric) layers in semiconductor integrated circuits. The material 50 can include a combination of materials. A surface treatment to enhance the radiation absorption of the surface 41, such as providing a microstructure as known in the art of solar cells, can be used. The embodiment described in conjunction with FIGS. 5A and 5B is further illustrated in FIG. 5C wherein the test circuit 14 has been attached to device 400 and activated. With the switch 15b closed, an ESD charge collects on the two conductors 11, 12. In this case, the voltage in the junction 13 is high enough to cause the voltage switchable polymer 10 in the junction 13 to conduct. With the surrounding voltage switchable polymer removed in area 19, the heat 22 generated by the ESD event, instead of having to conduct itself through surrounding voltage switchable polymer, is free to radiate, as indicated by arrows 20, from the peripheral surface 40 into and across the open area 19 and thence on and into the receiving surface 41. By using heat radiation 20 as the primary means for transferring heat 22 away from the peripheral area 40 of the junction 13 to a larger receiving surface 41, an ESD device made in this manner is less susceptible to failure due to overheating.

Figure 6:
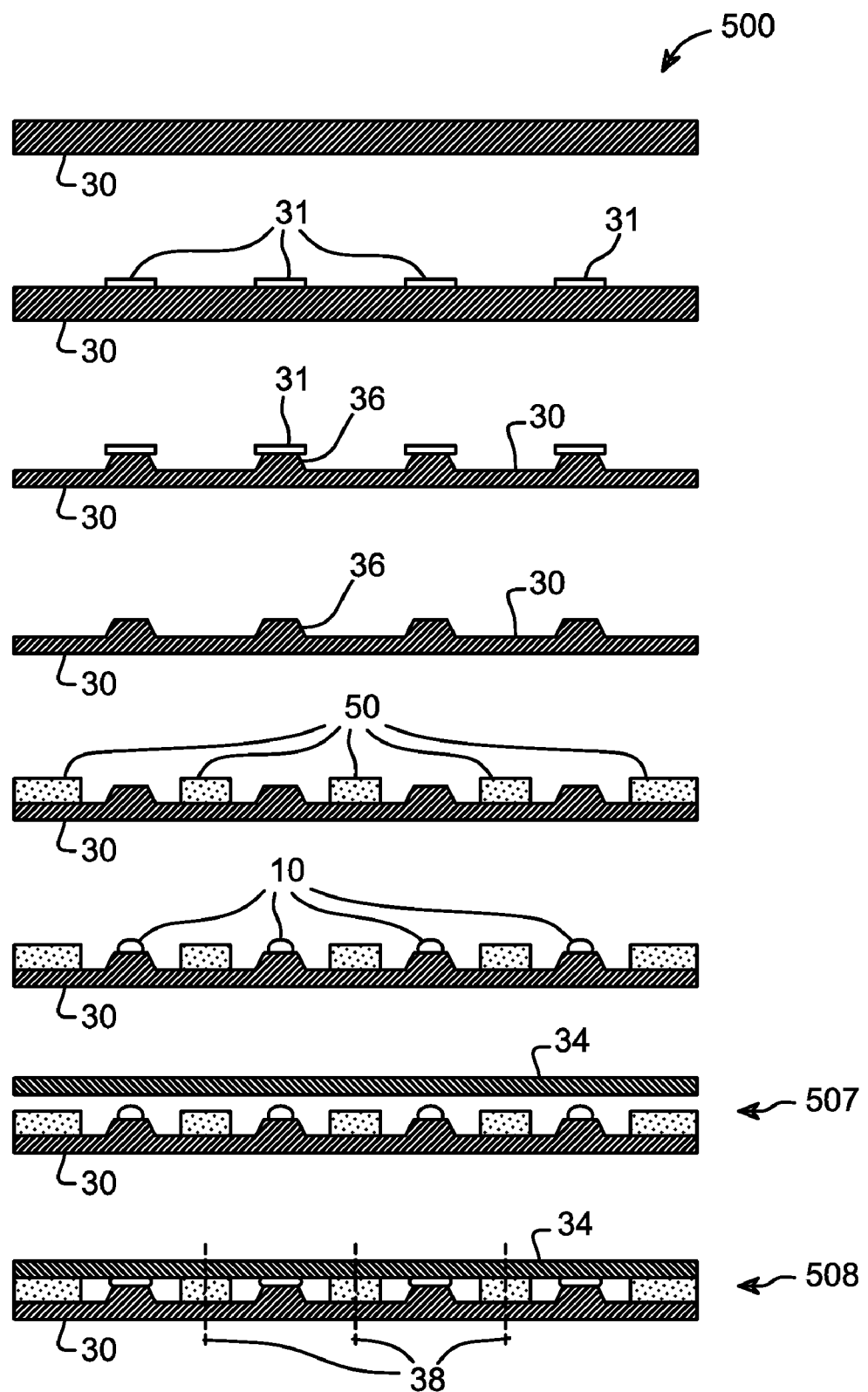
FIG. 6 is a section view of the process steps for constructing a second embodiment of the claimed invention.

FIG. 6 illustrates an embodiment of a process 500 for constructing radiating voltage switchable polymer ESD protection devices. A metallic substrate 30 is deposited with a mask 31 which defines places where ESD protection devices will form. The metal is etched leaving a pedestal 36. The mask 31 is stripped away leaving the metallic base 30 with pedestals 36. A non-conducting material 50 in form of a sheet with open areas 19, herein referred to as a "spacer", is added such that it exceeds the height of the pedestals 36 and wherein the difference in the height between the pedestals 36 and the spacer 50 will define the final thickness of the ESD voltage switchable polymer used for each voltage switchable polymer ESD device. ESD protection voltage switchable polymer 10 may be dispensed, in form of a droplet, for example, on each pedestal 36, with just enough material to ensure that surface of the pedestal will be covered once a cover 34 is placed on top. A conductive foil cover 34 is placed on top of the assembly, forcing the flattening of the ESD voltage switchable polymer 10 droplets into junction surrounded by an open area 19.

Figure 7:
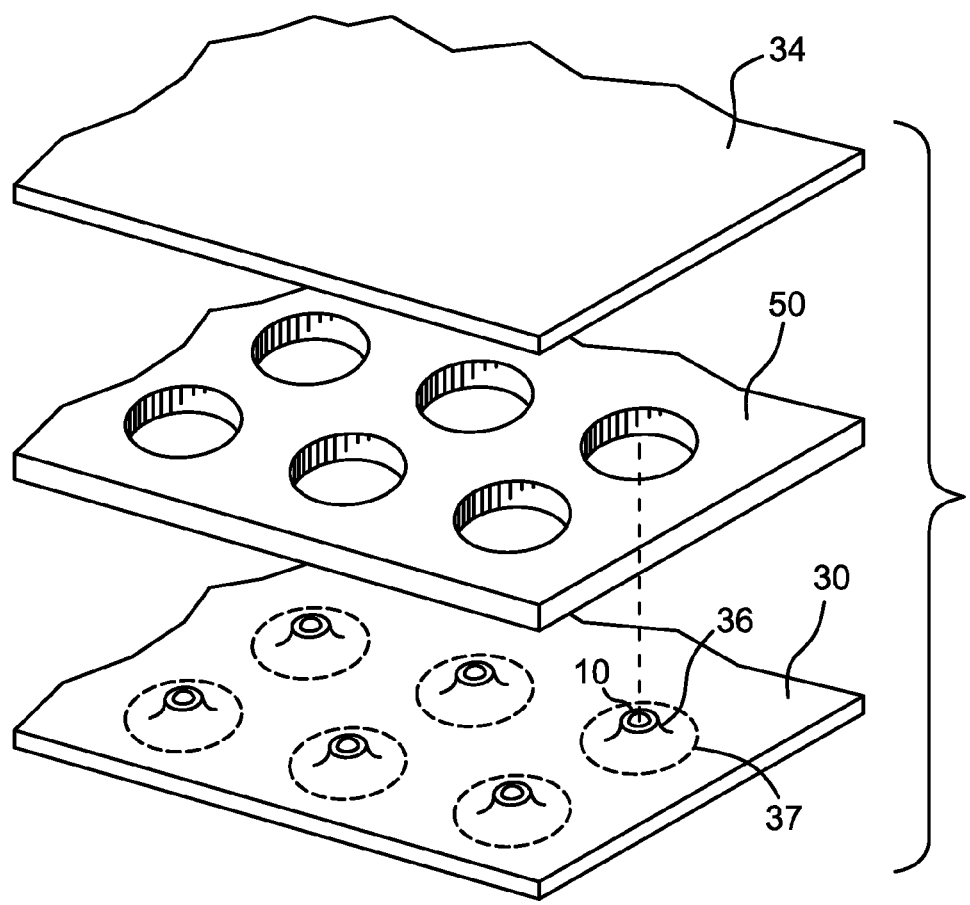
FIG. 7 is an expanded perspective view of third embodiment of the claimed invention being constructed.

FIG. 7 illustrates construction of a third embodiment of the device at step 507 of the FIG. 6 process, in expanded perspective view. This view shows how foil cover 34 is arranged just prior to covering spacer 50, ESD voltage switchable polymer 10 droplets, and pedestals 36 of substrate 30. The location of receiving surface 41, at the outer perimeter of the open area 19 of the devices, is indicated in phantom by circles 37 on substrate 30. Individual devices can be separated (extracted) from a panel of devices after step 508 of the process, along lines 38 shown in FIG. 6.

Figure 8:
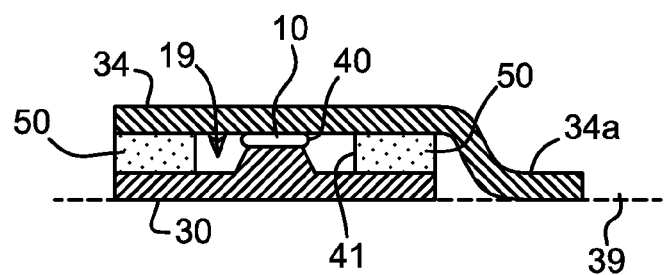
FIG. 8 is a section view of the device of the FIG. 6 embodiment.

FIG. 8 illustrates, in cross-sectional edge view, an individual ESD protection device extracted from a panel of devices, with one of its electrodes 34a formed to be co-planar with the other electrode 30 (in edge view, coincident with line 39) and thus made suitable for surface mounting using a soldering process.

Figure 9:
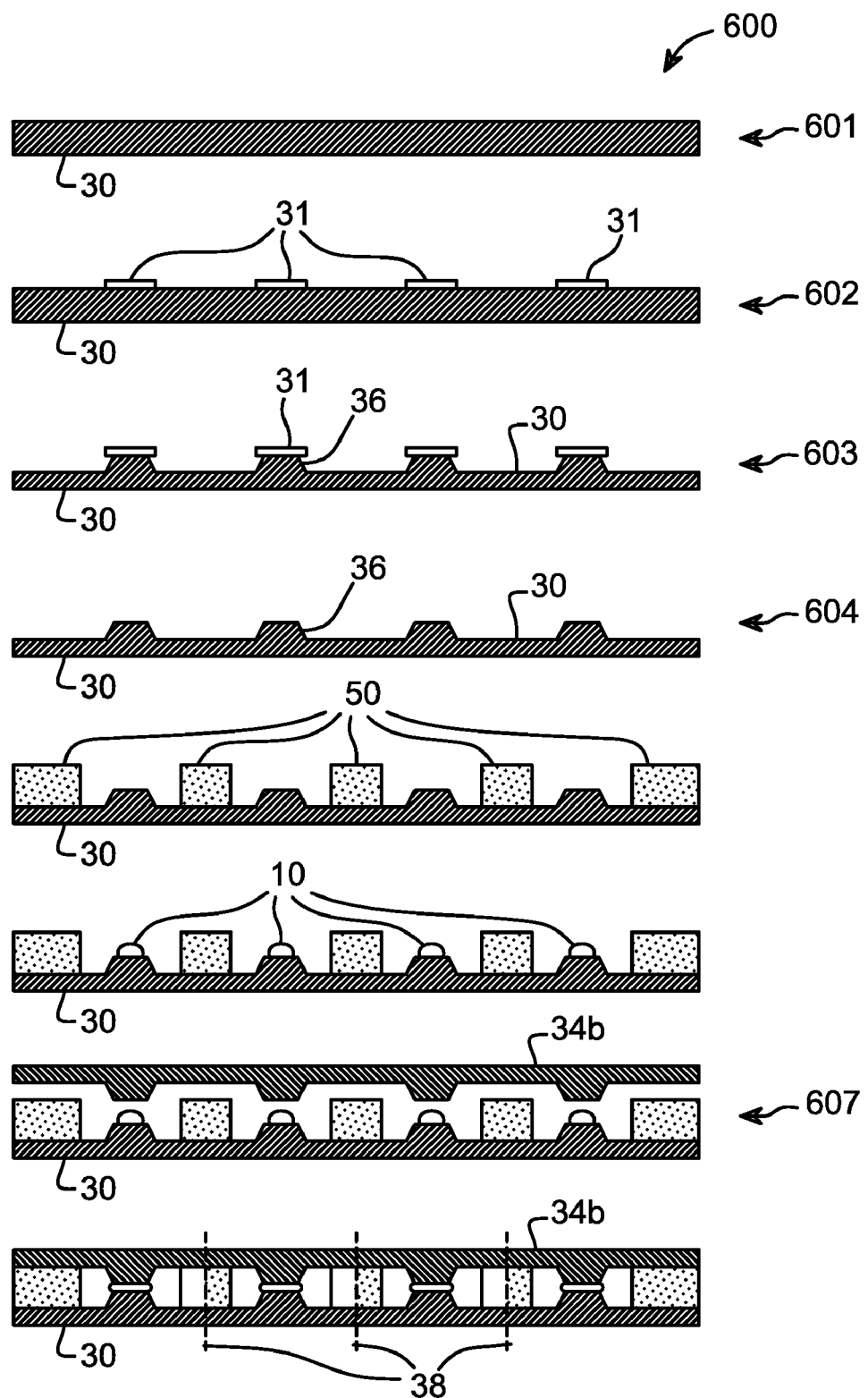
FIG. 9 is a section view of the process steps of a second embodiment of the method for constructing a fourth embodiment of the claimed invention.

FIG. 9 is a section view of the process steps of a second embodiment of the method for constructing a fourth embodiment of the claimed invention. The device, produced by process 600, includes an inverted second pedestal substrate replacing the foil cover 34 of the devices produced by process 500, for constructing radiating voltage switchable polymer ESD protection devices. In process 600, the steps 601-604 are performed twice, yielding two substrates 30 with pedestals 36, and one of these is inverted in step 607 for use as cover 34b.

Although the invention has been described with reference to specific exemplary embodiments thereof, it will be evident that various modifications and changes may be made thereto without departing from the broader spirit and scope of the invention, as set forth in the appended claims. The specification and drawings are, accordingly, to be regarded in an illustrative rather than a restrictive sense.

INDUSTRIAL APPLICABILITY

The inventive ESD devices, voltage switchable polymer 10, electrodes 11 and 12 heat radiating surface 40, radiation transmission material 19, spacer 50 and method for fabricating the device are intended to be widely used in a great variety of electron and communication applications. It is expected that they will be particularly useful in applications where significant resistance to electrostatic discharge is required.

As discussed previously herein, the applicability of the present invention is such that the inputting information and instructions are greatly enhanced, both in speed and versatility. The inventive ESD devices, voltage switchable polymer 10, electrodes 11 and 12 heat radiating surface 40, radiation transmission material 19, spacer 50 and method for fabricating the device may be readily produced and integrated with existing tasks, devices and the like; and since the advantages as described herein are provided, it is expected that they will be readily accepted in the industry. For these and other reasons, it is expected that the utility and industrial applicability of the invention will be both significant in scope and long-lasting in duration.

REFERENCE CHARACTER LIST

NOTICE: This reference character list is provided for informational purposes only, and it is not a part of the official patent application.
10 ESD voltage switchable polymer (layer)
11, 12 conductive electrode
13 junction
14 ESD test circuit
15a open switch
15b closed switch
16 capacitor
17 heat conduction
18, 22 heat (generated in the junction by an ESD event)
19 open area, transmission material, transmission window
20 heat radiation
21 conductor material
30 metallic substrate, base
31 mask
34 foil cover
34a electrode (formed to be coplanar)
34b cover (inverted substrate with pedestals)
36 pedestal
38 device separation lines
37 location (of receiving surface 41 on substrate 30)
39 line (coplanar edge of electrodes)
40 peripheral, heat radiating surface (of junction)
41 receiving surface (for radiated heat)
50 non-conducting material, spacer
100 typical ESD protection circuit
102 diode
104 I/O pad (terminal) of IC chip
200 current-art ESD protection device using voltage switchable polymer
300 ESD protection device with additional conductor material
400 radiating ESD protection device according to the invention
500 process for constructing radiating ESD protection devices
600 second embodiment of process for constructing radiating ESD protection devices

What is claimed is:

1. A method for manufacturing the ESD protection device comprising the steps of,
    patterning a first planar electrode with etch resisting mask material, and,
    etching said first planar electrode reducing the surface of said first planar electrode around the mask material revealing ESD electrode features, and,
    removing said mask material, and,
    adding a spacer material to the first planar electrode, and,
    dispensing ESD voltage switchable polymer onto the ESD electrode features, and, further
    adding a second planar electrode on top of said spacer material, forcing the ESD voltage switchable polymer to spread out against the first and second planar electrodes.

2. A method for manufacturing the ESD protection device as in claim 1, further comprising the step of bonding said second planar electrode to said spacer material attached to said first planar electrode.

3. A method for manufacturing the ESD protection device as in claim 1, wherein the dispensing ESD voltage switchable polymer onto the ESD electrode features comprises dispensing a quantity of the ESD voltage switchable polymer sufficient to cover said first planar electrode when compressed against said second planar electrode.

4. A method for manufacturing the ESD protection device as in claim 1, wherein said second planar electrode is further reduced to produce electrode features.

5. A method for manufacturing the ESD protection device comprising the steps of:
    patterning a first planar electrode with etch resisting mask material, and,
    patterning a second planar electrode in mirror image to the first planar electrode with etch resisting mask material, and,
    etching the first and second planar electrodes so that respective surfaces of the first and second planar electrodes around the mask material are reduced revealing ESD electrode features on first and second etched electrodes, and,
    removing the mask material on both the first and second etched electrodes, and,
    adding a spacer material to the first etched electrode, and,
    dispensing ESD voltage switchable polymer onto the ESD electrode features in a quantity sufficient to cover the ESD electrode features when compressed, and,
    adding the second etched electrode on top of the spacer material, forcing the ESD voltage switchable polymer to spread out against the first and second etched electrodes, and,
    bonding of the second etched electrode to the spacer material attached to the first etched electrode.

6. An ESD protection device comprising:
    a first planar electrode extending in a first direction;
    a second planar electrode extending in a second direction perpendicular to the first direction to intersect the first planar electrode at an intersecting location;
    a voltage switchable polymer between the first and second planar electrodes at the intersecting location, wherein a lower surface of the voltage switchable polymer contacts the first planar electrode and an upper surface of the voltage switchable polymer, opposite the lower surface, contacts the second planar electrode, the voltage switchable polymer further comprising an exposed radiating surface that is perpendicular to the upper and lower surfaces; and
    a surrounding material substantially surrounding the voltage switchable polymer, the surrounding material having an exposed receiving surface spaced apart from the voltage switchable polymer and configured to receive radiation emitted from the exposed radiating surface.

7. The device of claim 6 wherein the exposed receiving surface is spaced apart from the exposed radiating surface by a gap that is free of the voltage switchable polymer.

8. The device of claim 7 wherein the exposed receiving surface is spaced apart from the exposed radiating surface by the gap that is free of a material comprising the exposed radiating surface.

* * * * *